US006670628B2

United States Patent
Lee et al.

(10) Patent No.: US 6,670,628 B2
(45) Date of Patent: Dec. 30, 2003

(54) LOW HEAT LOSS AND SMALL CONTACT AREA COMPOSITE ELECTRODE FOR A PHASE CHANGE MEDIA MEMORY DEVICE

(75) Inventors: Heon Lee, Sunnyvale, CA (US); Dennis M. Lazaroff, Corvallis, OR (US)

(73) Assignee: Hewlett-Packard Company, L.P., Houston, TX (US)

( * ) Notice: Subject to any disclaimer, the term of this patent is extended or adjusted under 35 U.S.C. 154(b) by 35 days.

(21) Appl. No.: 10/116,507

(22) Filed: Apr. 4, 2002

(65) Prior Publication Data

US 2003/0189200 A1 Oct. 9, 2003

(51) Int. Cl.[7] .............................................. H01L 47/00
(52) U.S. Cl. ................................................ 257/4; 257/2
(58) Field of Search .......................... 257/2, 4, 52, 57, 257/66

(56) References Cited

U.S. PATENT DOCUMENTS

| | | | |
|---|---|---|---|
| 5,166,758 A | | 11/1992 | Ovshinsky et al. ............. 257/3 |
| 5,687,112 A | * | 11/1997 | Ovshinsky ................... 365/163 |
| 5,912,839 A | | 6/1999 | Ovshinsky et al. ..... 365/185.03 |
| 5,933,365 A | | 8/1999 | Klersy et al. ................ 365/148 |
| 6,015,977 A | * | 1/2000 | Zahorik .......................... 257/4 |
| 6,147,395 A | * | 11/2000 | Gilgen ........................ 257/529 |
| 6,150,253 A | * | 11/2000 | Doan et al. .................. 438/597 |
| RE37,259 E | * | 7/2001 | Ovshinsky ................... 365/163 |
| 2003/0071255 A1 | * | 4/2003 | Xu ................................. 257/2 |

* cited by examiner

Primary Examiner—Richard Elms
Assistant Examiner—Christian D. Wilson
(74) Attorney, Agent, or Firm—Trueman H. Denny, III

(57) ABSTRACT

A low heat loss and small contact area electrode structure for a phase change media memory device is described. The memory device includes a composite electrode that includes a dielectric mandrel that is connected with a substrate and having a tapered shape that terminates at a vertex. An electrically conductive material conformally covers the dielectric mandrel and terminates at a tip. A first dielectric layer covers all of the composite electrode except an exposed portion of the composite electrode that is adjacent to the tip. A phase change media is in contact with the exposed portion. The exposed portion is only a small percentage of an overall surface area of the composite electrode so that a contact footprint between the exposed portion and the phase change media is small relative to a surface area of the phase change media and Joule heat transfer from the phase change media into the composite electrode is reduced.

10 Claims, 13 Drawing Sheets

LOW HEAT LOSS AND SMALL CONTACT AREA COMPOSITE ELECTRODE FOR A PHASE CHANGE MEDIA MEMORY DEVICE

FIELD OF THE INVENTION

The present invention relates generally to a composite electrode including a low heat loss and small contact area interface with a phase change media. More specifically, the present invention relates to a phase change media memory device in which a composite electrode includes an exposed portion in contact with the phase change media. The exposed portion comprises a small percentage of an overall area of the composite electrode such that there is a small area footprint between the exposed portion and the phase change media and the small area footprint reduces heat transfer from the phase change media to the composite electrode.

BACKGROUND OF THE ART

Memory storage devices based on a phase change material to store information are being considered as an alternative to conventional data storage devices such as hard discs and flash memory, just to name a few. In a phase change material based memory device, data is stored as one of two physical states of the phase change material.

For instance, in an amorphous state, the phase change material can represent a binary zero "0" and the state of the phase change material can be determined by passing a current through two electrodes in contact with the phase change material and sensing a voltage drop across the phase change material. If in the amorphous state, the phase change material has a high resistance, then the voltage drop will be high.

Conversely, the state of the phase change material can be altered to a crystalline state that represents a binary one "1" by passing a current of sufficient magnitude through the electrodes such that the phase change material undergoes Joule heating. The heating transforms the phase change material from the amorphous state to the crystalline state. As mentioned above, a voltage drop across the phase change material can be used to sense the state of the phase change material. Therefore, if in the crystalline state, the phase change material has a low resistance, then the voltage drop will be low.

Another way of expressing the state of the phase change material is that in the amorphous state, the phase change material has a low electrical conductivity and in the crystalline state, the phase change material has a high electrical conductivity.

Ideally, there should be a large enough difference between the high resistance of the amorphous state and the low resistance of the crystalline state to allow for accurate sensing of the state of the phase change material. Moreover, in a memory device based on an array of phase change material storage cells, some of the storage cells will be in the amorphous state and others will be in the crystalline state. It is desirable to have a minimal variation in the high resistance among the storage cells in the amorphous state and to have a minimal variation in the low resistance among the storage cells in the crystalline state. If either variation is too large, it may be difficult or impossible to accurately sense the state of the phase change material.

In FIG. 1, a prior phase change storage cell 100 includes a first electrode 103, a second electrode 105, a dielectric 107, and a phase change material 101 positioned in the dielectric 107 and in electrical communication with the first and second electrodes (103, 105). Typically, the dielectric 107 forms a chamber that surround the phase change material 101. To alter the state of the phase change material 101 from an amorphous state a (denoted by vertical hash lines) to a crystalline state C (see horizontal hash lines in FIG. 2), a current I is passed through the first and second electrodes (103, 105). The flow of the current I through the phase change material 101 causes the phase change material 101 to heat up due to Joule heating J.

In FIG. 2, a heat H generated by the current I is primarily dissipated through the first and second electrodes (103, 105) because the first and second electrodes (103, 105) are made from a material having a high thermal conductivity, such as an electrically conductive metal, for example. To a lesser extent, a heat h' is dissipated through the dielectric 107 because the dielectric 107 has a lower thermal conductivity than the first and second electrodes (103, 105). For instance, the dielectric 107 can be a layer of silicon oxide ($SiO_2$).

As the heat H flows through the phase change material 101, a portion of the phase change material 101 undergoes crystallization to a crystalline state C (denoted by horizontal hash lines), while another portion of the phase change material 101 remains in the amorphous state a.

One disadvantage of the prior phase change storage cell 100 is that not all of the energy contained in the Joule heat J is used in transforming the state of the phase change material 101 from the amorphous state a to the crystalline state C. Instead, a significant portion of the Joule heat J is wasted because it is thermally conducted away from the phase change material 101 by the first and second electrodes (103, 105). As a result, more current I is required to generate additional Joule heat J to overcome the heat loss through the first and second electrodes (103, 105).

Increasing the current I is undesirable for the following reasons. First, an increase in the current I results in increased power dissipation and it is desirable to reduce power dissipation in electronic circuits. Second, an increase in the current I requires larger driver circuits to supply the current I and larger circuits consume precious die area. In general, it is usually desirable to conserve die area so that more circuitry can be incorporated into an electronic circuit. Finally, in battery operated devices, an increase in the current I will result in a reduction in battery life. As portable electronic devices comprise an increasingly larger segment of consumer electronic sales, it is desirable to reduce current drain on battery powered electronics so that battery life can be extended.

In FIG. 3, a plurality of the prior phase change storage cell 100 are configured into an array to define a prior phase change memory device 111. Each storage cell 100 is positioned at an intersection of the first and second electrodes (103, 105), a plurality of which are arranged in rows for the second electrode 105 and columns for the first electrode 103.

In FIGS. 3 and 4, one disadvantage of the prior phase change memory device 111 is that during a write operation to a selected phase change storage cell denoted as 100', a substantial portion of the heat H generated by the current I dissipates through the first and second electrodes (103, 105) and into adjacent phase change storage cells 100. Consequently, there is thermal cross-talk between adjacent storage cells 100. Thermal cross-talk can slow down a switching speed of the phase change memory device 111 and can cause the aforementioned variations in resistance among the storage cells 100.

Another disadvantage of the prior phase change memory device 111 is that a surface of the phase change material 101 has a large contact area $C_A$ with the first and second electrodes (103, 105) (only the second electrode 105 is shown) and that large contact area $C_A$ promotes heat transfer from the phase change material 101 into the first and second electrodes (103, 105).

In FIGS. 3 and 4, the contact area $C_A$ is the result of a large portion of a surface area of the phase change material 101 being in contact with the first and second electrodes (103, 105) such that the heat H transfers easily from the phase change material 101 into the electrodes. The large contact area $C_A$ also contributes to the aforementioned thermal cross-talk. Moreover, heat loss from any given storage cell 100, thermal cross-talk from adjacent storage cells 100, and the contact area $C_A$ acting individually or in combination can lead to wide variations in resistance among the storage cells 100. For instance, if one storage cell 100 has its phase change material 101 preheated due to thermal cross-talk and another storage cell 100 does not have its phase change material 101 preheated, then when the phase change material 101 of both cells undergoes Joule heating J, the preheated cell 100 will have a greater percentage of its phase change material 101 crystallized than the non-preheated cell 100. Consequently, there may be variations in resistance between preheated and non-preheated cells. As was mentioned previously, variations in resistance are undesirable.

Consequently, there exists a need for a conductor structure for a phase change media memory device that reduces transfer of Joule heat from the phase change media and that reduces the amount of current necessary to alter the state of the phase change media. There exists a need for a conductor structure that reduces variations in resistance among phase change memory cells in a array. There is also need for a conductor structure that reduces thermal cross-talk and that reduces the surface area of contact between a conductor and the phase change media.

SUMMARY OF THE INVENTION

The low heat loss and small contact area electrode structure of the present invention solves the aforementioned disadvantages and limitations. The disadvantages associated with heat loss due to heat transfer into the electrodes is solved by a composite electrode that includes an exposed portion that is in contact with a phase change media. The exposed portion is only a small percentage of an overall surface area of the composite electrode so that a contact footprint between the exposed portion and the phase change media is small relative to a surface area of the phase change media. Consequently, only a small area of the phase change media is in contact with the exposed portion of the composite electrode and heat transfer into the composite electrode due to Joule heating is reduced.

The disadvantages associated with increasing current to compensate for heat loss through the electrodes is also solved by the composite electrode of the present invention because the exposed portion thereof presents a low thermal conductivity path to heat generated in the phase change media.

Variations in resistance among cells of phase change media in an array are reduced by the composite electrode of the present invention due to a low thermal cross-talk resulting from minimal heat transfer to the composite electrode.

Additionally, the disadvantages associated with a large contact surface area between the prior phase change material and its electrodes are solved by the contact footprint between the exposed portion of the composite emitter and the phase change media of the present invention.

Other aspects and advantages of the present invention will become apparent from the following detailed description, taken in conjunction with the accompanying drawings, illustrating by way of example the principles of the present invention.

DETAILED DESCRIPTION

Figure 1:
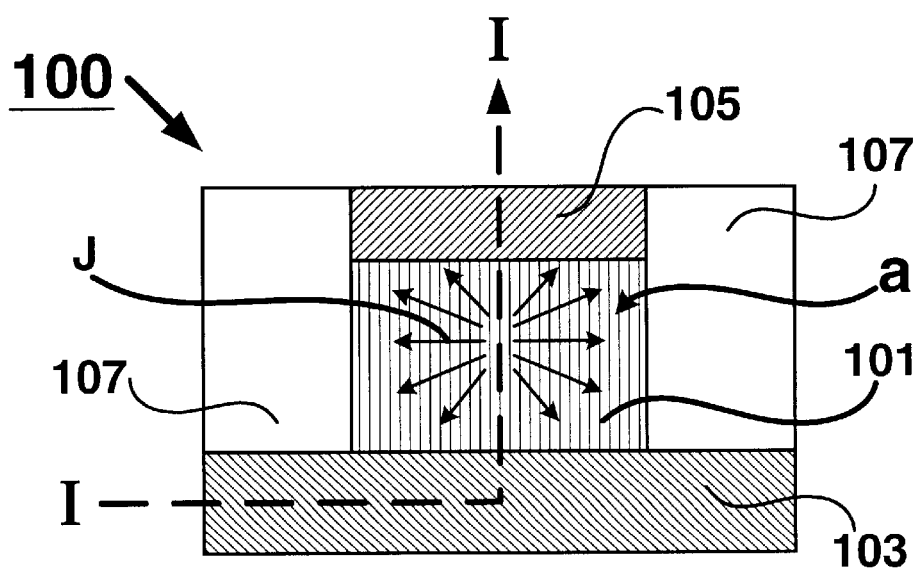
FIG. 1 is a cross-sectional view of a prior phase change storage cell.
Figure 2:
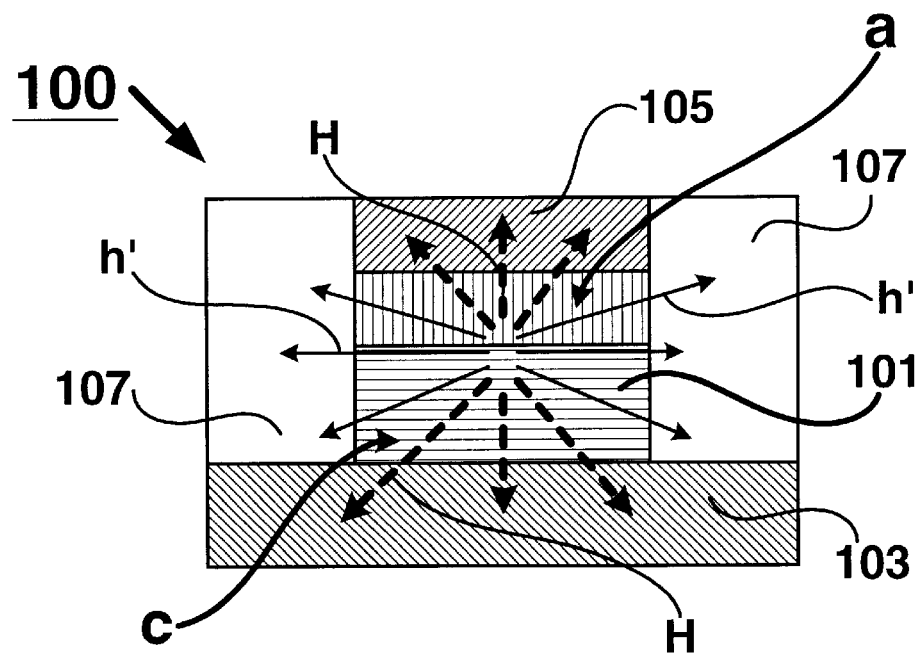
FIG. 2 is a cross-sectional view of a prior phase change storage cell depicting Joule heat loss through a pair of electrodes.
Figure 3:
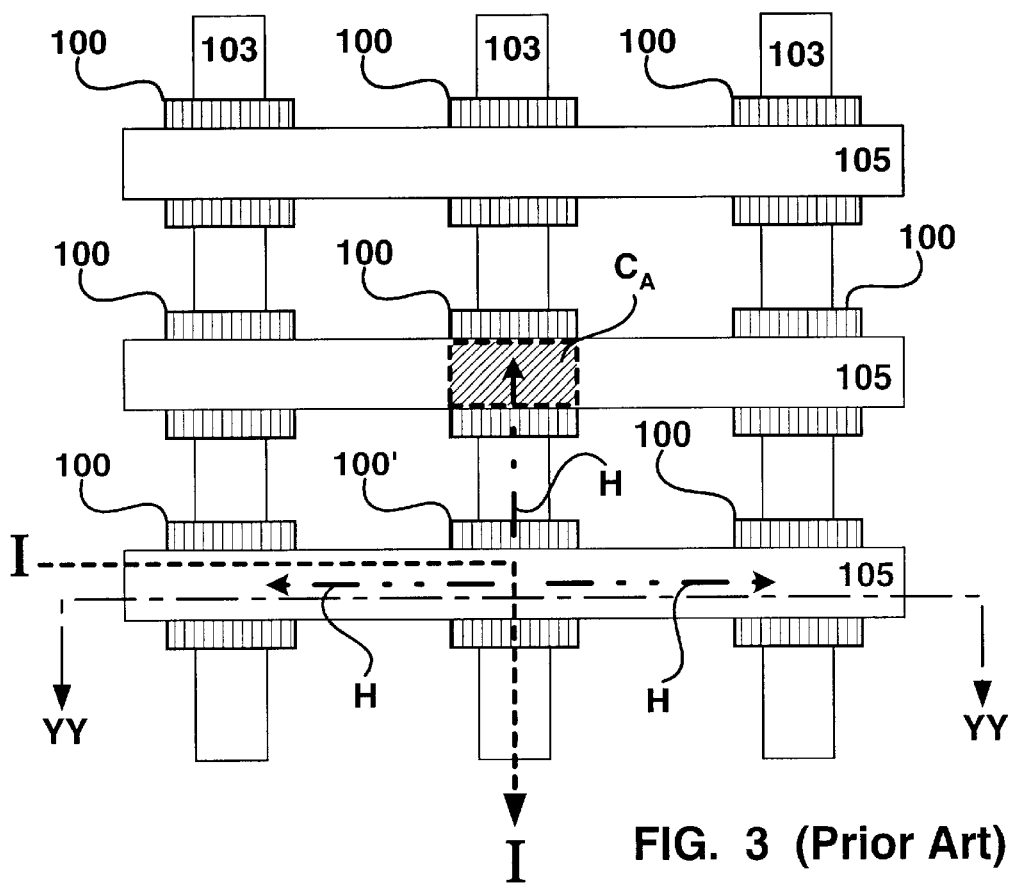
FIG. 3 is a top plan view of a prior phase change memory device.
Figure 4:
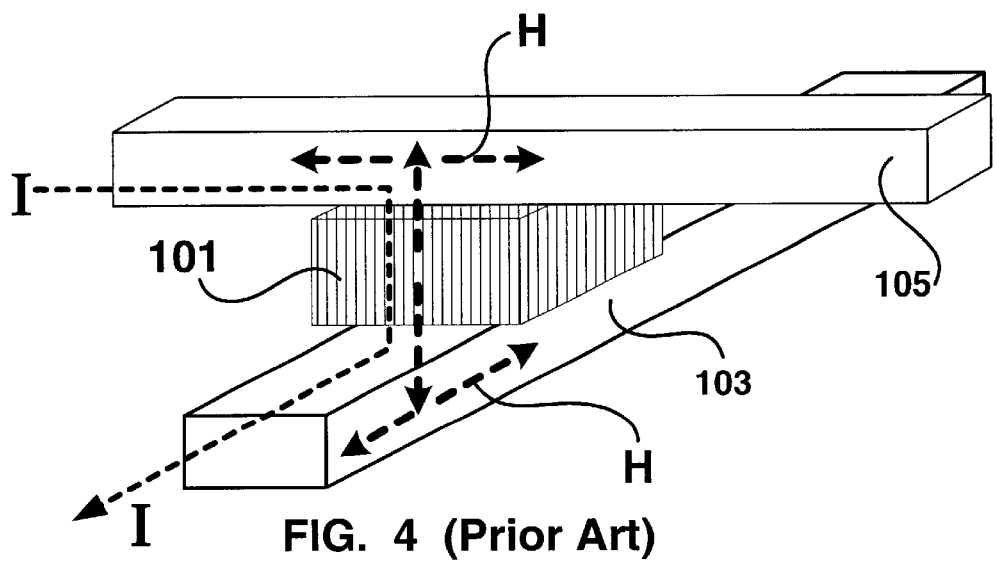
FIG. 4 is a cross-sectional view of heat loss through a prior phase change storage cell during a write operation.

In the following detailed description and in the several figures of the drawings, like elements are identified with like reference numerals.

As shown in the drawings for purpose of illustration, the present invention is embodied in a low heat loss and small contact area electrode structure for a phase change media memory device and a method of fabricating the same.

The low heat loss and small contact area electrode structure for a phase change media memory device includes a substrate and a composite electrode that includes a dielectric mandrel that is connected with the substrate and having a tapered shape that terminates at a vertex. An electrically conductive material conformally covers the dielectric mandrel and terminates at a tip. A first dielectric layer covers all of the composite electrode save an exposed portion of the composite electrode that is adjacent to the tip. A phase change media is connected with the first dielectric layer and the exposed portion of the composite electrode. A second dielectric layer is in contact with the first dielectric layer and the phase change media. An electrode is in contact with the phase change media.

The exposed portion is only a small percentage of an overall surface area of the composite electrode so that a contact footprint between the exposed portion and the phase change media is small relative to a surface area of the phase change media. By passing a current between the electrode and the composite electrode, the phase change media undergoes Joule heating in a region proximate the contact footprint between the exposed portion and the phase change media. Because only a small portion of the composite electrode and the phase change media are in contact with each other, heat transfer from the phase change media into the composite electrode is reduced.

The reduced contact area between the composite electrode and the phase change media addresses the aforementioned disadvantages of the prior electrode structures. First, only a small percentage of the composite electrode is in contact with the phase change media. Therefore, heat loss and thermal cross-talk are reduced. Second, because heat loss is reduced, a magnitude of a write current necessary to crystallize the phase change media can also be reduced. Fourth, the contact footprint between the exposed portion and the phase change media address the problems associated with a large surface area of the prior phase change material being in contact with the prior electrodes. Finally, the reduced heat loss and thermal cross-talk minimize variations in resistance.

Figure 5A:
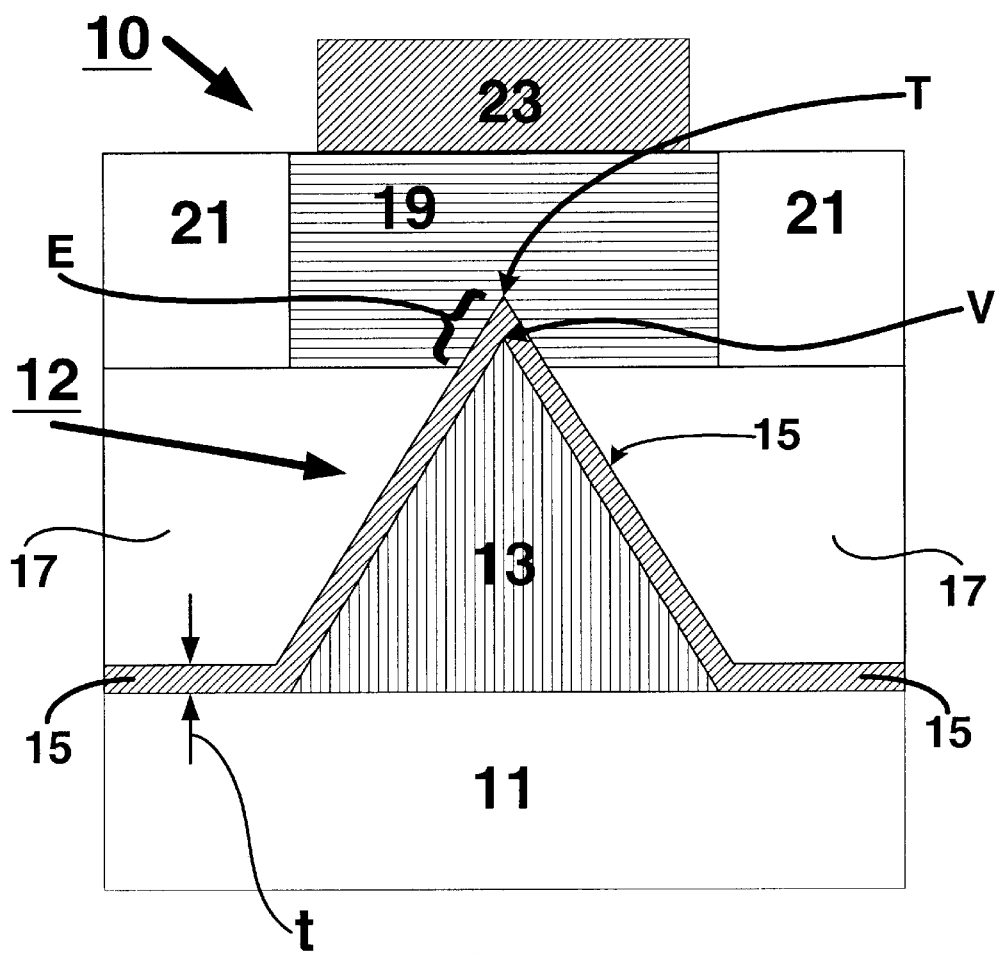
FIG. 5A is a cross-sectional view of a low heat loss and small contact area electrode structure for a phase change media device according to the present invention.

In FIG. 5A, a low heat loss and small contact area electrode structure for a phase change media memory device 10 includes a substrate 11, a composite electrode 12 that includes a dielectric mandrel 13 that is in contact with the substrate 11. The dielectric mandrel 13 has a tapered shape that terminates at a vertex V. That is, the dielectric mandrel 13 is broad at a base B and is very narrow at the vertex V (see FIG. 8F). The composite electrode 12 further includes an electrically conductive material 15 that conformally covers the dielectric mandrel 13 and terminates at a tip T. Because the electrically conductive material 15 conformally covers the dielectric mandrel 13, the electrically conductive material 15 has a shape that complements the shape of the dielectric mandrel 13. Therefore, the composite electrode 12 is broad at the substrate 11 and narrow at the tip T.

A first dielectric layer 17 completely covers the composite electrode 12 except for an exposed portion E that is adjacent to the tip T. Therefore, a substantial portion of a surface area of the electrically conductive material 15 is covered by the first dielectric layer 17 and a small portion of the electrically conductive material 15 (i.e. the exposed portion E) is not covered by the first dielectric layer 17. For example, if the electrically conductive material 15 has a thickness of about 2000 Å, then the exposed portion E may extend outward of the first dielectric layer 17 by a distance of about 200 Å. A phase change media 19 is in contact with the first dielectric layer 17 and the exposed portion E. A second dielectric layer 21 is in contact with the first dielectric layer 17 and the phase change media 19. An electrode 23 is in contact with the phase change media 19.

Figure 6:
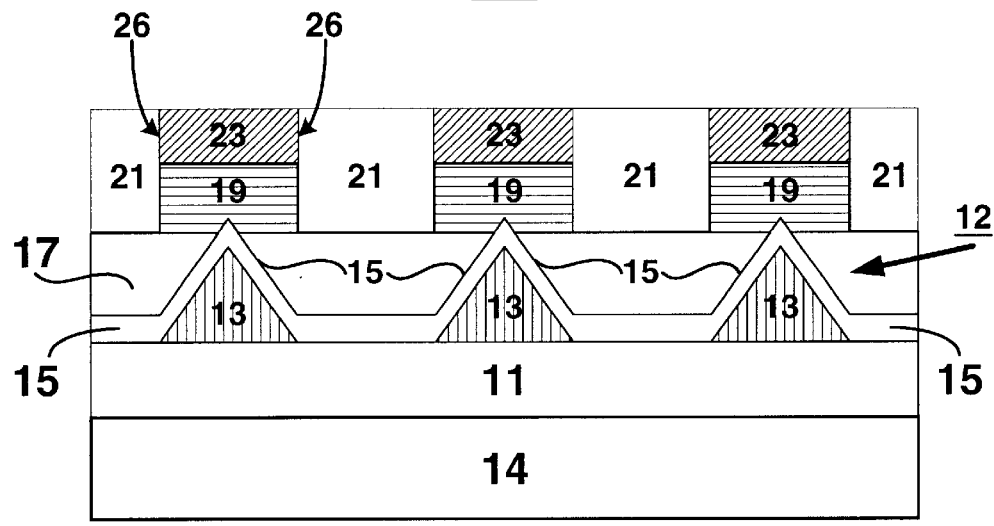
FIGS. 6 and 7 are cross-sectional views of a low heat loss and small contact area electrode structure for a phase change media device according to the present invention.
Figure 7:
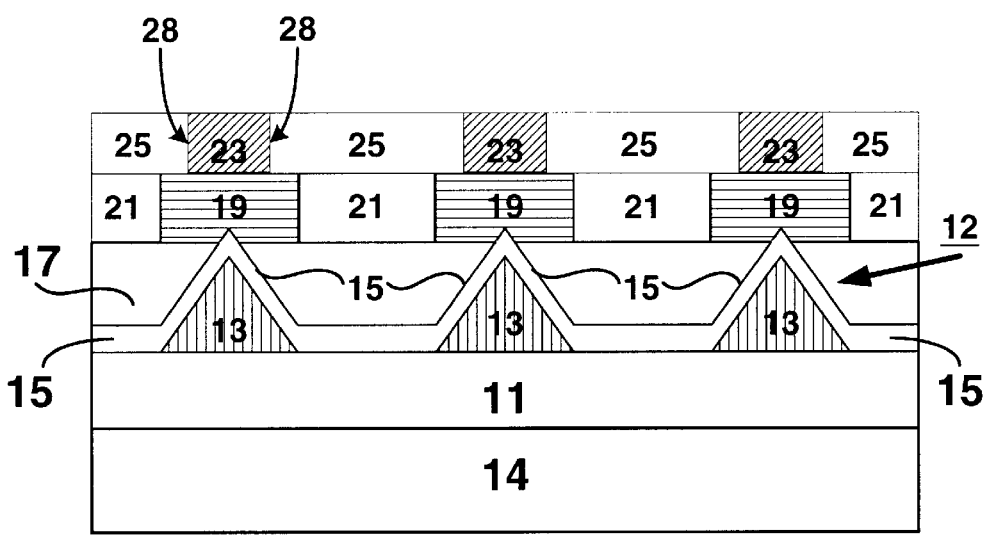

Alternatively, the electrode 23 can be in contact with the phase change media 19 and the second dielectric layer 21. In FIG. 6, the second dielectric layer 21 can include a via 26 therein that extends to the first dielectric layer 17. The phase change media 19 can be positioned in the via 26 with the electrode 23 also positioned in the via 26 and in contact with both the phase change media 19 and the second dielectric layer 21. In FIG. 7, an interconnect structure including a third dielectric layer 25 includes a via 28 therein that extends to the second dielectric layer 21. The electrode 23 is positioned in the via 28 and is in contact with the phase change media 19.

The electrode 23 and the composite electrode 12 are operative to form an electrically conductive path through the phase change media 19. The electrodes (12, 23) can be in electrical communication with a current source (not shown). Passing a current through the electrodes (12, 23) generates Joule heating within the phase change media 19 and a portion of the phase change media 19 changes from an amorphous state to a crystalline state as will be described below.

Figure 5B:
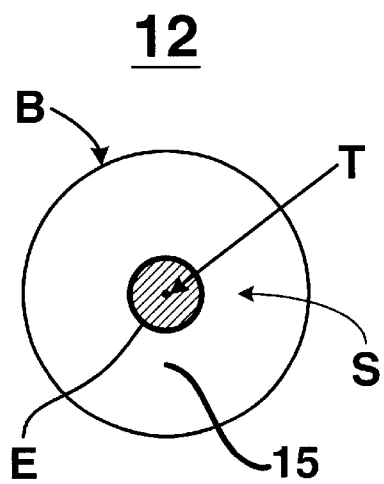
FIGS. 5B and 5C are top plan views of a composite electrode having a conical shape and a pyramid shape respectively according to the present invention.
Figure 10A:
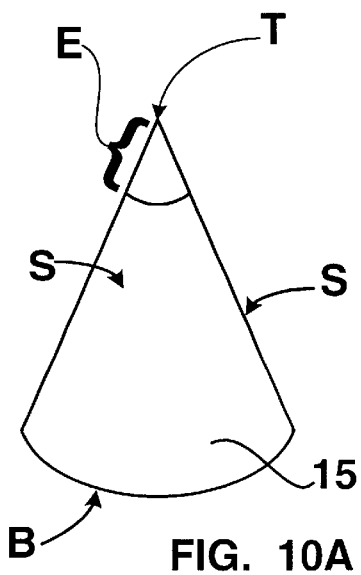
FIGS. 10A, 10B, 11A, and 11B are profile views of possible shapes for a composite electrode according to the present invention.

As previously mentioned, the dielectric mandrel 13 has a tapered shape that is broad B at the substrate 11 and tapers to the vertex V. The composite electrode 12 has a shape that complements the shape of the dielectric mandrel 13. In FIGS. 5B and 10A, the composite electrode 12 is depicted in isolation to better illustrate its shape. The composite electrode 12 can have a shape that includes but is not limited to a cone shape. In FIGS. 5B and 10A, the composite electrode 12 tapers from the broad base B to the tip T such that the electrically conductive material 15 has a sloping surface S. In the top plan view of FIG. 5B and the profile view of FIG. 10A, the overall surface area of the electrically conductive material 15 is substantially larger than the area of the exposed portion E.

Figure 5C:
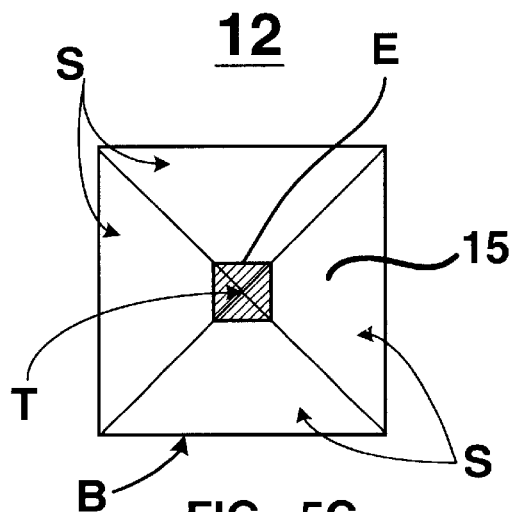
Figure 10B:
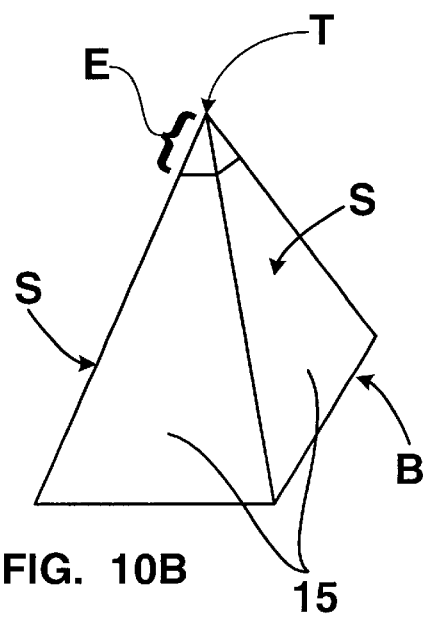

Similarly, in FIG. 5C and FIG. 10B, the composite electrode 12 can have a shape that includes but is not limited to a pyramid shape. The composite electrode 12 tapers from the broad base B to the tip T and the electrically conductive surface 15 has a sloping surface S. In the top plan view of FIG. 5C, each side of the pyramid (four are shown) slopes upward to the tip T. As mentioned above, in FIGS. 5C and 10B, the overall surface area of the electrically conductive material 15 is substantially larger than the area of the exposed portion E.

Figure 11A:
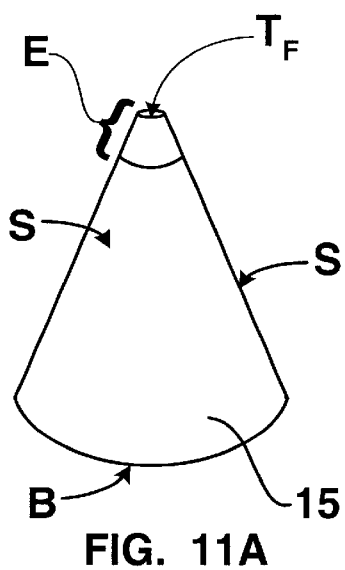
Figure 11B:
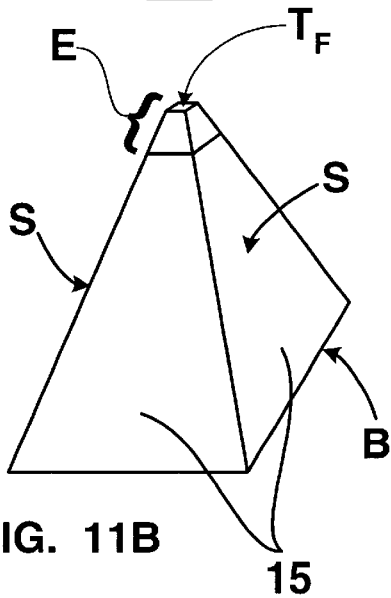

The pyramid and cone shapes of FIGS. 5B, 5C, 10A, and 10B need not terminate at a sharp tip T, and the composite electrode 12 can have a shape that includes but is not limited a frustum of a cone as depicted in FIG. 11A wherein the composite electrode 12 tapers to a frustum tip $T_F$. On the other hand, the composite electrode 12 can have a shape that includes but is not limited a frustum of a pyramid as depicted in FIG. 11B wherein the composite electrode 12 tapers to a frustum tip $T_F$. In FIGS. 5B, 5C, 10A, 10B, 11A, and 11B, the exposed portion E is a small percentage of the overall surface area of the electrically conductive material 15 of the composite electrode 12.

The electrically conductive material 15 and the electrode 23 can be made from a material including but not limited to those set forth in TABLE 1 below. Moreover, alloys of the materials set forth in TABLE 1 below can also be used for the electrically conductive material 15 and the electrode 23.

TABLE 1

Materials for the electrically conductive material 15 and the electrode 23

A Metal
Aluminum (Al)
Tungsten (W)
Molybdenum (Mo)
Titanium (Ti)
Copper (Cu)

The second dielectric layer 21 and the third dielectric layer 25 can be made from a material including but not limited to those set forth in TABLE 2 below.

TABLE 2

Materials for the second dielectric layer 21 and the third dielectric layer 25

Silicon Oxide (SiO$_2$)
Silicon Nitride (Si$_3$N$_4$)

The first dielectric layer 17 can be made from a material including but not limited to those set forth in TABLE 3 below.

TABLE 3

Materials for the first dielectric layer 17

Tetraethylorthosilicate (TEOS)
A Boron (B) doped Tetraethylorthosilicate (BSG)
A Phosphorus (P) doped Tetraethylorthosilicate (PSG)
A Boron (B) and Phosphorus (P) doped Tetraethylorthosilicate (BPSG)
Silicon Oxide (SiO$_2$)

Figure 8A:
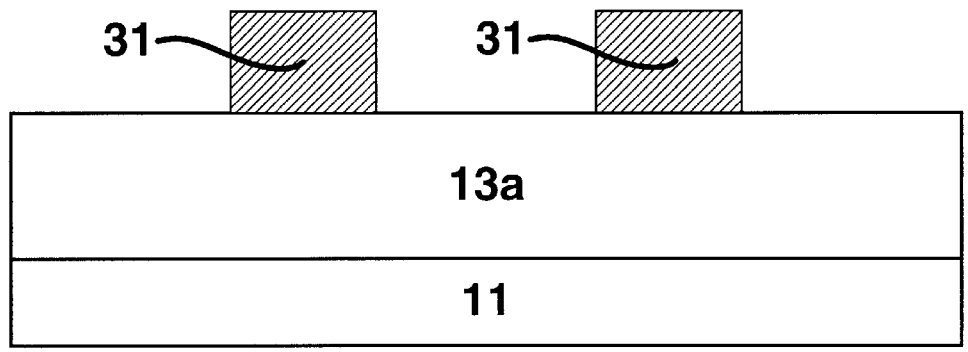
FIGS. 8A through 8R depict a method of making a low heat loss and small contact area electrode structure for a phase change media device according to the present invention.

The dielectric mandrel 13 can be a dielectric layer that is connected with the substrate 11 (see reference numeral 13a in FIG. 8A). For instance, the dielectric layer 13a can be connected with the substrate 11 by a method such as depositing, growing, or sputtering. For example, the dielectric layer 13a can be a layer of silicon oxide (SiO$_2$) that is deposited on the substrate 11. The substrate 11 can be a semiconductor substrate such as silicon (Si), for example. As another example, the substrate 11 can be a silicon substrate and the dielectric layer 13a can be formed by oxidizing a surface of the silicon substrate to form a layer of silicon oxide (SiO$_2$). Alternatively, the dielectric layer 13a can be a layer of glass, such as PYREX™, that is deposited on the substrate 11.

Figure 5D:
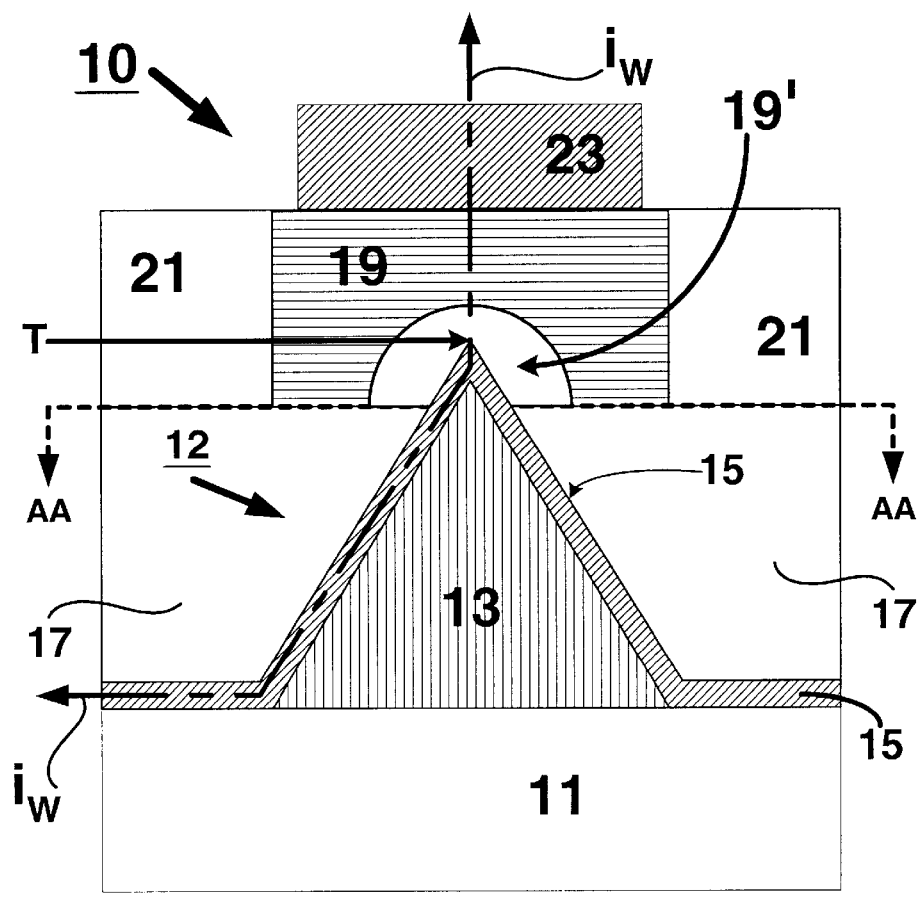
FIG. 5D is a cross-sectional view of a write operation to a phase change media device according to the present invention.

In FIG. 5D, a write current $i_W$, flowing through the electrodes (12, 23) and the phase change media 19 generates Joule heating within the phase change media 19. As the phase change media 19 heats up due to the Joule heating, a portion of the phase change media 19 is transformed from an amorphous state to a crystalline state 19'. In FIG. 5D, the amorphous state is denoted as 19 and the crystalline state is denoted as 19'. The Joule heating of the phase change media 19 occurs in a region proximate the exposed portion E.

One advantage of the present invention is that only a portion of a volume of the phase change media 19 that surrounds the exposed portion E is transformed to the crystalline state 19'. The portion of the phase change media 19 that is in the crystalline state 19' allows for consistency in a resistance of the phase change media as measured across the electrodes (12, 23). Consequently, because a small volume of the phase change media 19 can be consistently crystallized by a given magnitude of the write current $i_W$, variations in resistance are minimized. Another benefit of crystallizing only a small volume of the phase change media 19 is that power consumption is reduced because the magnitude of the write current $i_W$, the duration of the write current $i_W$, or both can be reduced as the entirety of the phase change media 19 need not be crystallized during the write operation.

Figure 5E:
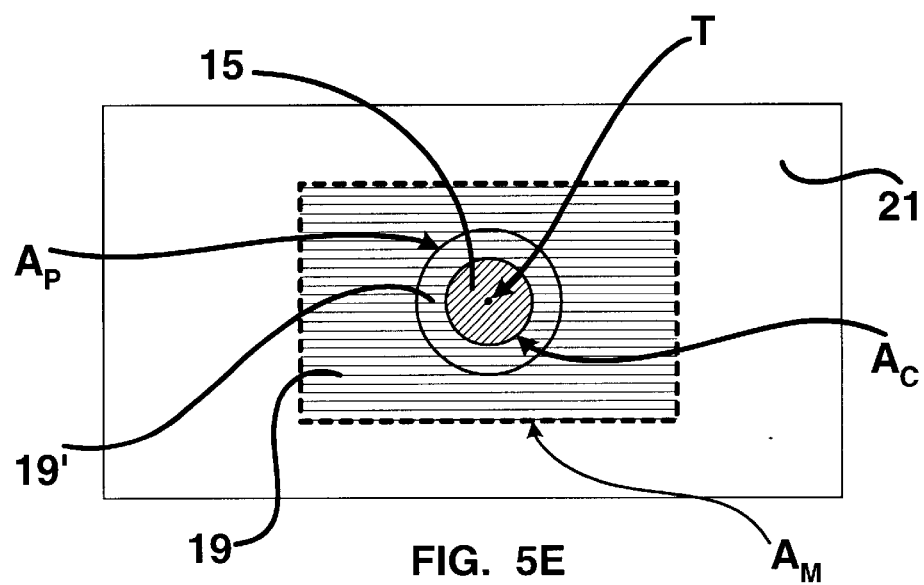
FIG. 5E is a top plan view taken along line AA of FIG. 5D depicting a contact footprint according to the present invention.

In FIG. 5E, a cross-sectional view along dashed line AA of FIG. 5D illustrates an area $A_C$ of a contact footprint between the exposed portion E of the electrically conductive material 15 and the phase change media 19. The phase change media 19 has a total cross-sectional area $A_M$ (shown in dashed line). As is depicted in FIG. 5E, $A_C \ll A_M$, that is, the contact footprint area $A_C$ is much less than the total cross-sectional area $A_M$. Similarly, the portion of the phase change media 19 that undergoes a phase change to the crystalline state 19' has an area $A_P$ that is also less than the total cross-sectional area $A_M$. Therefore, the primary effect of the Joule heat on the phase change media 19 is to heat only a relatively small volume of the phase change media 19 surrounding the contact footprint area $A_C$.

Figure 5F:
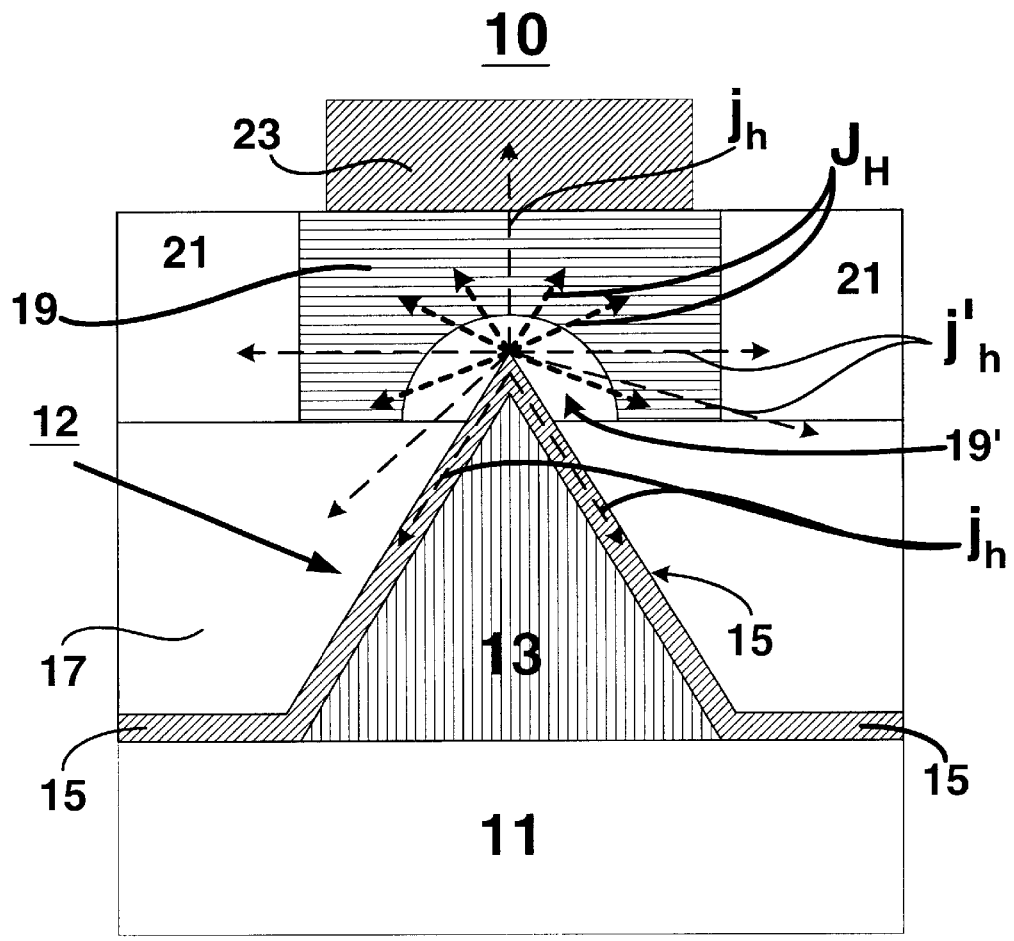
FIG. 5F is a cross-sectional view of thermal transfer of heat from a phase change media to a composite electrode according to the present invention.

In FIG. 5F, Joule heat, generated by the current $i_W$ (not shown), is thermally transferred primarily into the phase change media 19 as shown by the heavy dashed arrows $J_H$. Due to the aforementioned contact footprint area $A_C$, only a small portion of the Joule heat is thermally transferred into the electrically conductive material 15 of the composite electrode 12 or the electrode 23 as shown by the lighter dashed arrows $j_h$. Some of the Joule heat may also be thermally transferred into the first and second dielectric layers (17, 21) as depicted by dashed arrows $j'_h$.

Figure 5G:
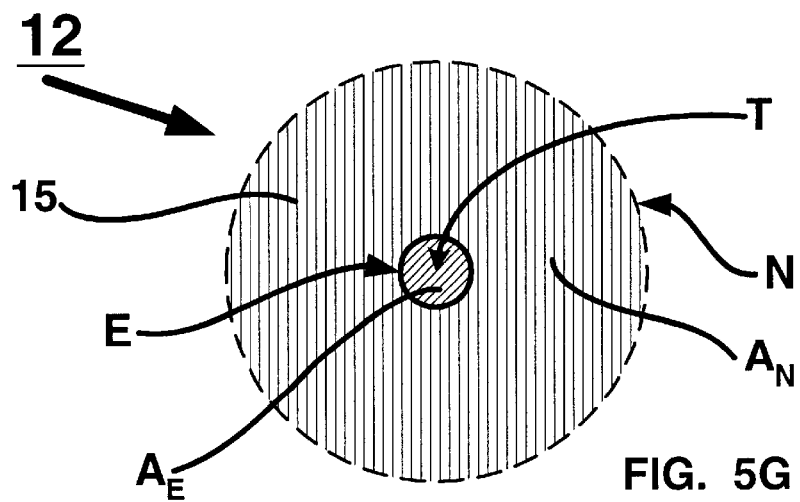
FIG. 5G is a top plan view of a relationship between an overall surface area of a composite emitter and a surface area of an exposed portion thereof according to the present invention.

In FIG. 5G, the small portion of Joule heat $j_h$ that thermally transfers into the electrically conductive material 15 of the composite electrode 12 is due to the exposed portion E having an exposed area $A_E$ that is in thermal contact with the phase change media 19; whereas a substantially larger portion N of the electrically conductive material 15 having an area $A_N$ is not in direct contact with the phase change media 19. Accordingly, the surface area of the composite electrode 12 that is available as a direct thermal conduction path for the phase change media 19 is limited to the exposed area $A_E$.

Figure 9:
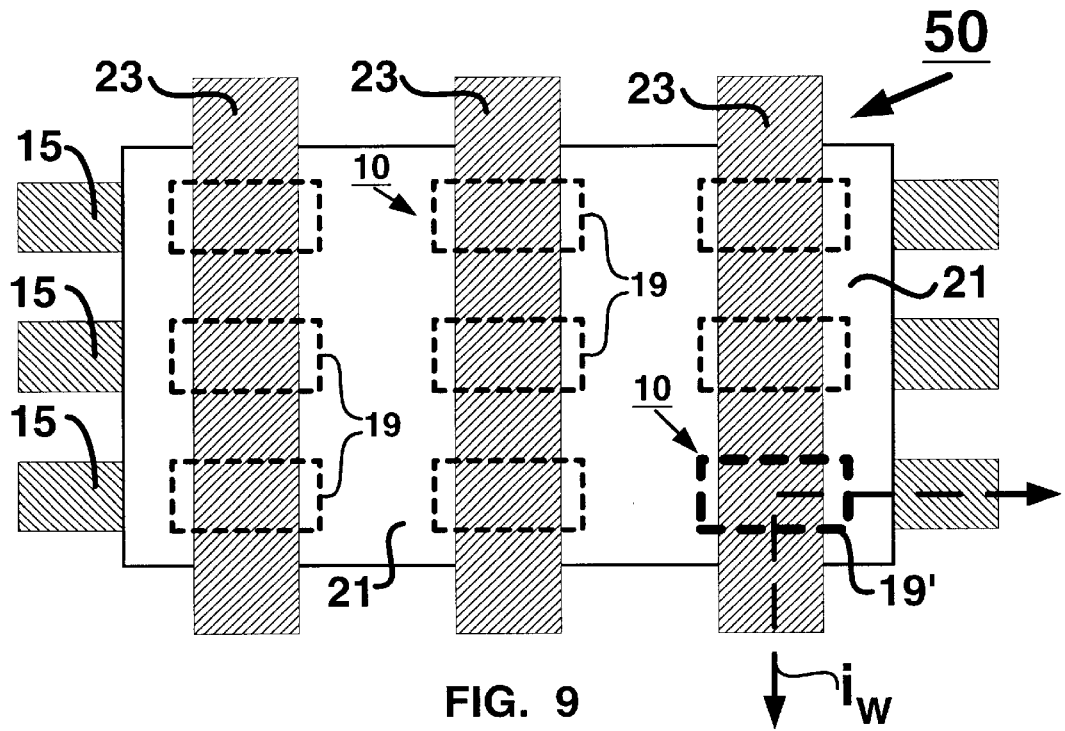
FIG. 9 is a top plan view of a phase change media memory according to the present invention.

In FIG. 9, a plurality of the low heat loss and small contact area electrode structure for a phase change media memory devices 10 of the present invention can be arranged in an array 50 wherein the memory devices 10 are positioned along rows and columns of the array 50. In FIG. 9, the electrically conductive material 15 of the composite electrode 12 are arranged as row conductors and the electrodes 23 are arranged as column conductors.

On the other hand, the electrically conductive material 15 of the composite electrode 12 can be columns conductors and the electrodes 23 can be row conductors. The memory devices 10 are positioned at an intersection of the electrodes (15, 23) and the phase change media 19 of each memory cell 10 is depicted as dashed outline. The phase change media 19' of one of the memory cells 10 is selected for a write operation by passing the current $i_W$ through the electrodes (15, 23) that cross that cell 10.

Another advantage of the low heat loss and small contact area electrode structure for a phase change media memory devices 10 of the present invention is that as the phase change media 19' undergoes Joule heating during the write operation, the reduced heat transfer into the composite electrode 12 and the electrode 23 reduces thermal cross-talk between adjacent memory cells 10 in the array 50.

Figure 8B:
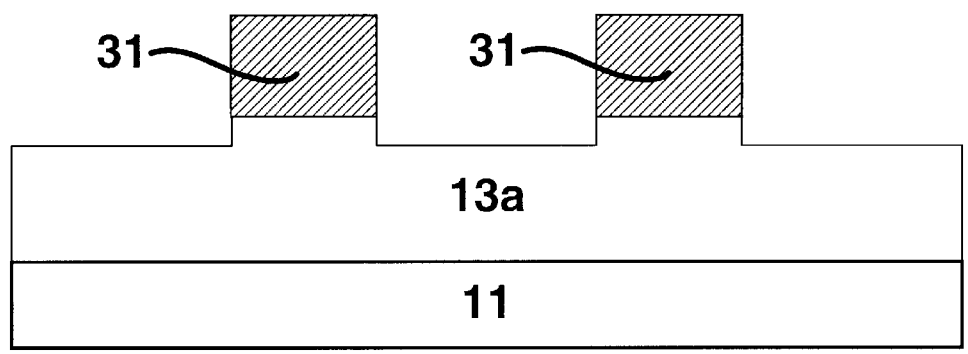
Figure 8C:
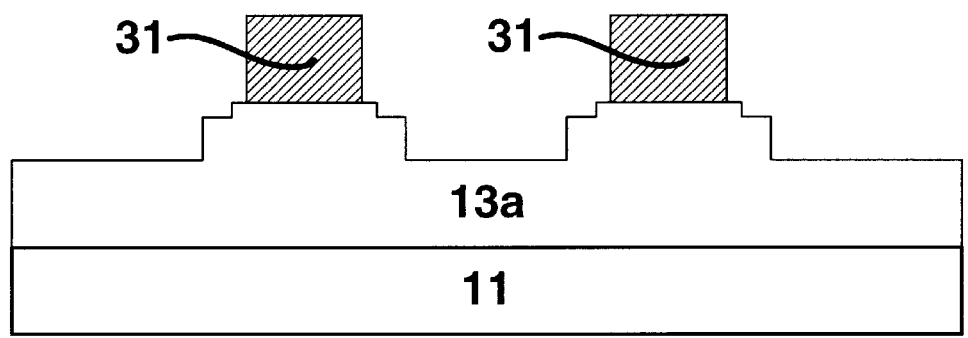
Figure 8D:
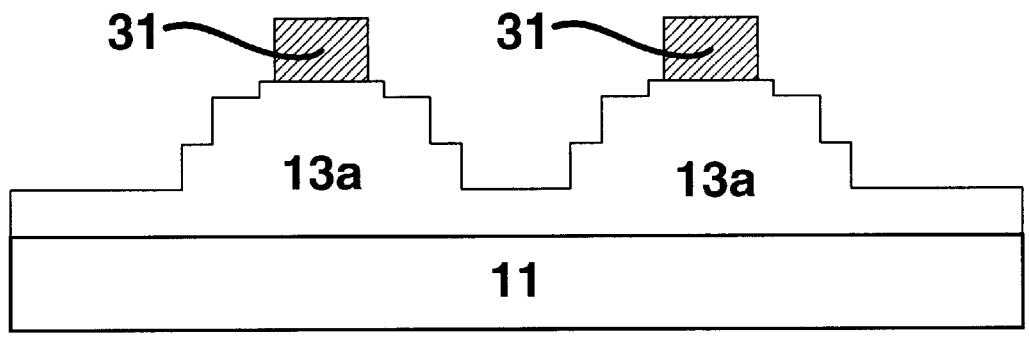
Figure 8E:
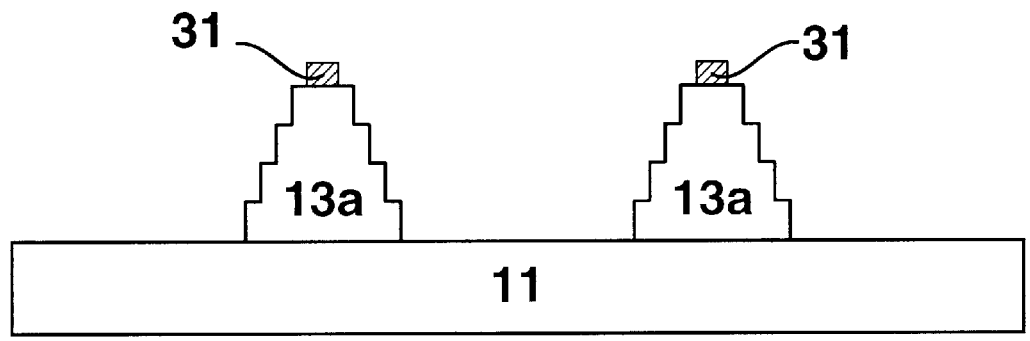
Figure 8F:
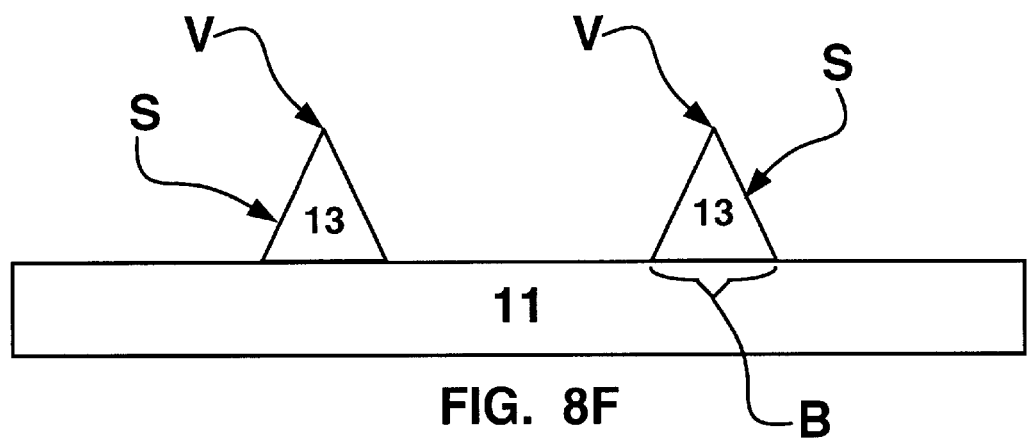
Figure 8G:
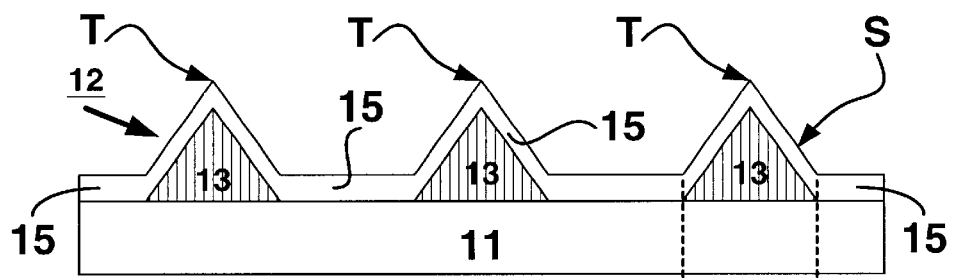
Figure 8H:
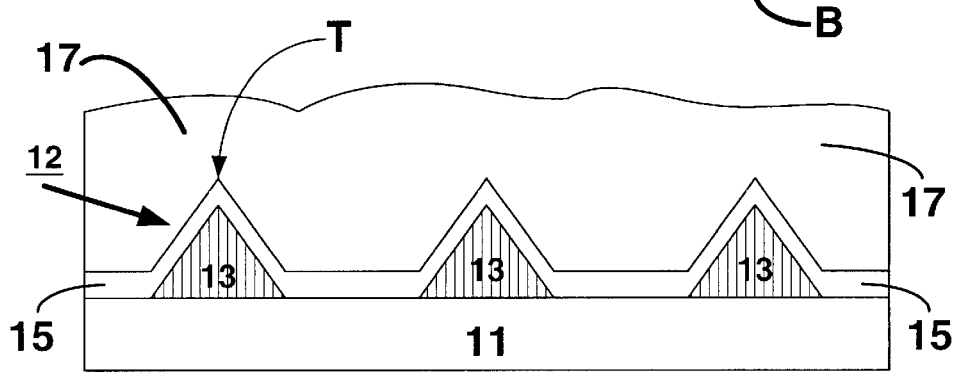
Figure 8I:
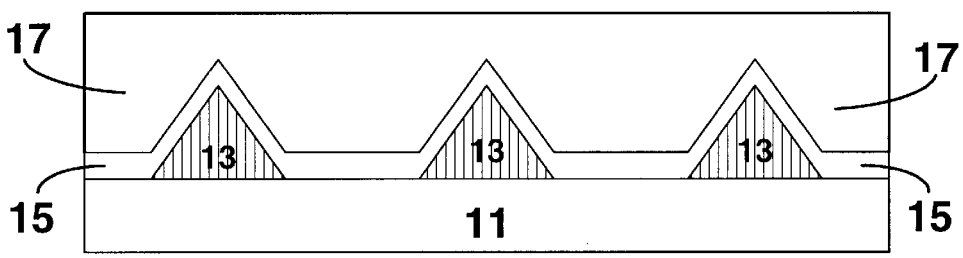
Figure 8J:
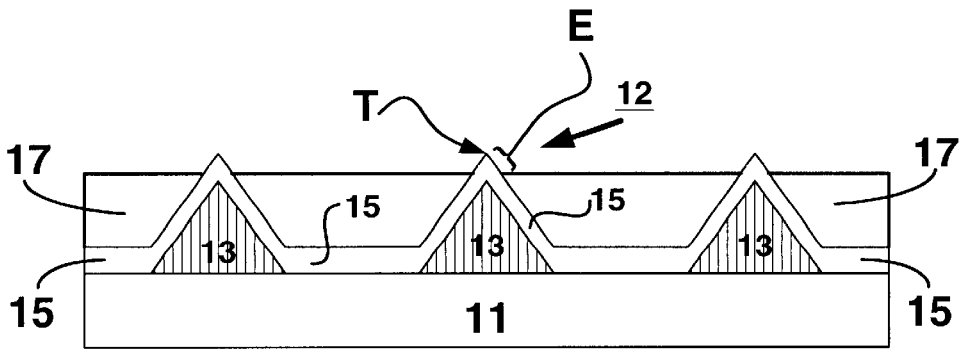
Figure 8K:
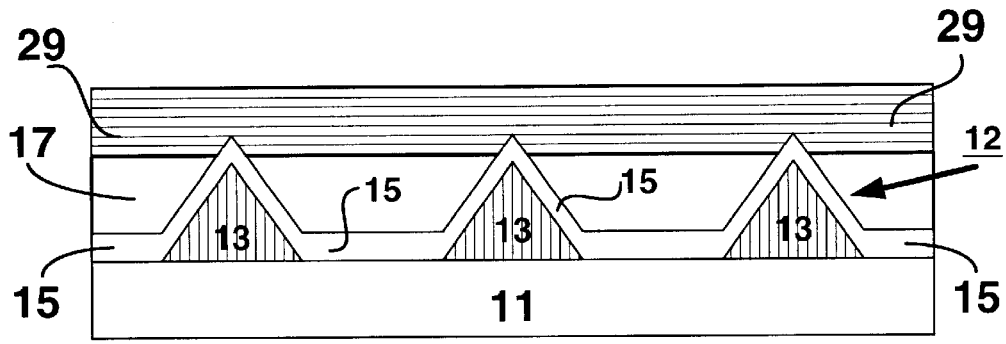
Figure 8L:
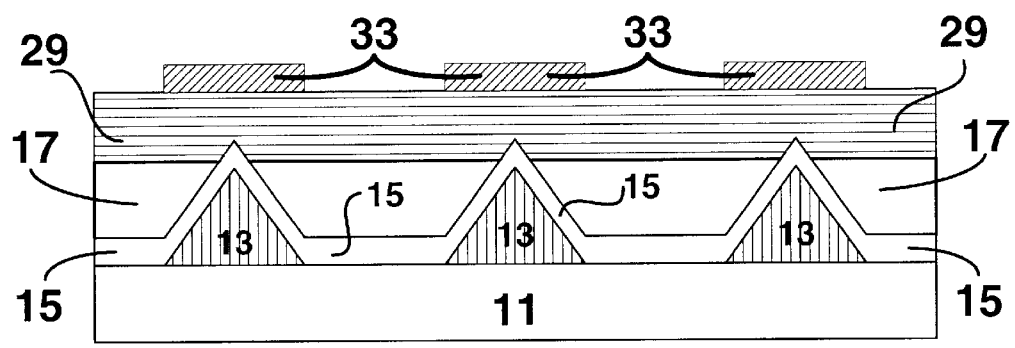
Figure 8M:
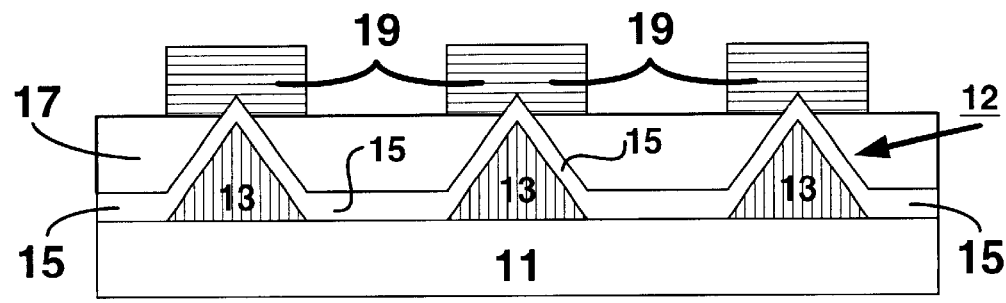
Figure 8N:
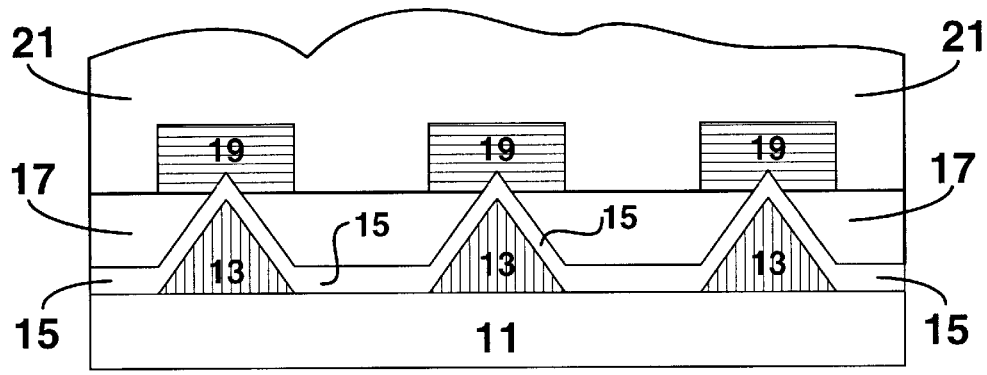
Figure 8O:
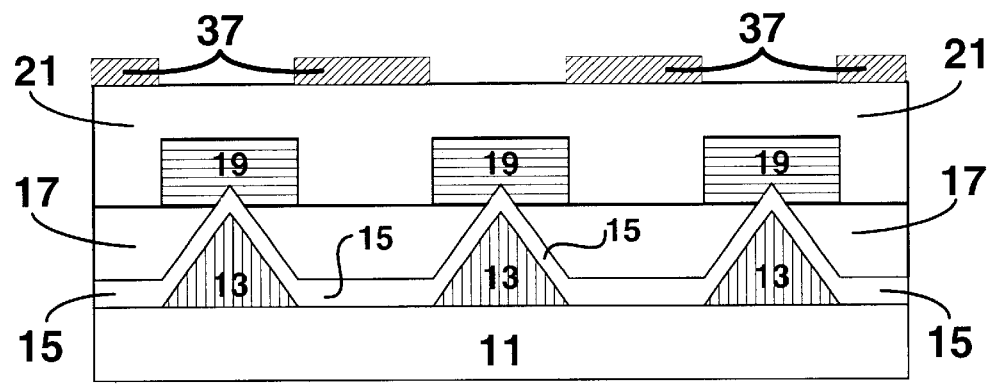
Figure 8P:
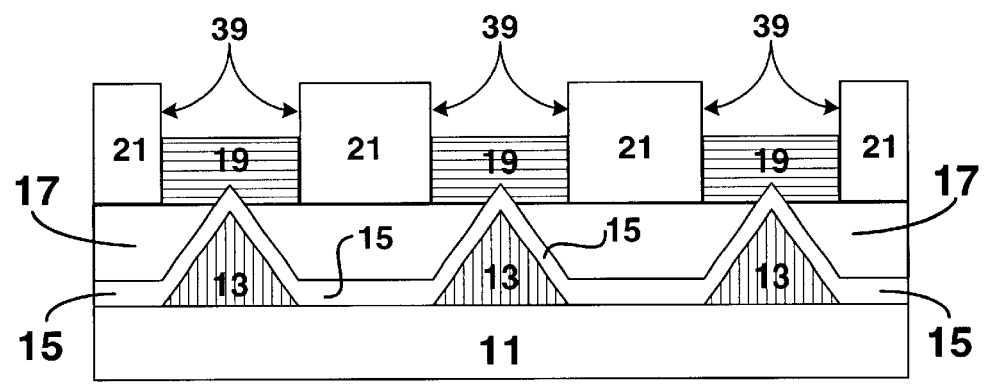
Figure 8Q:
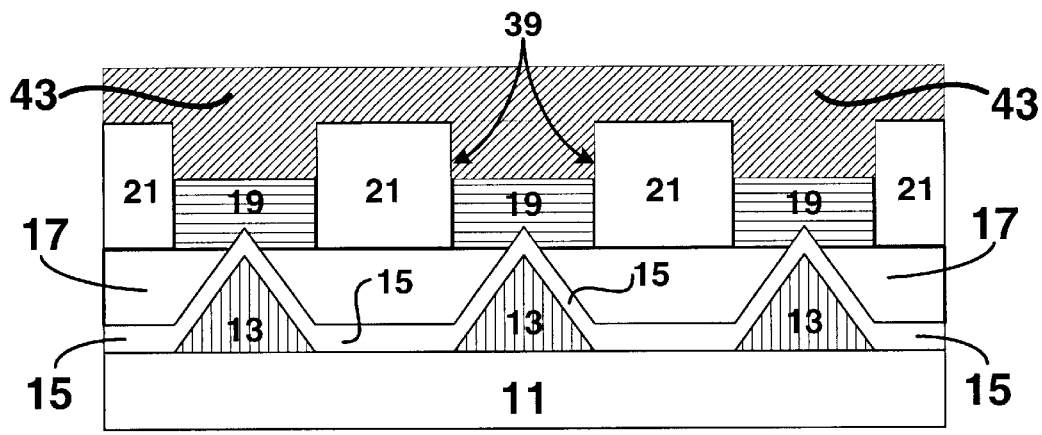
Figure 8R:
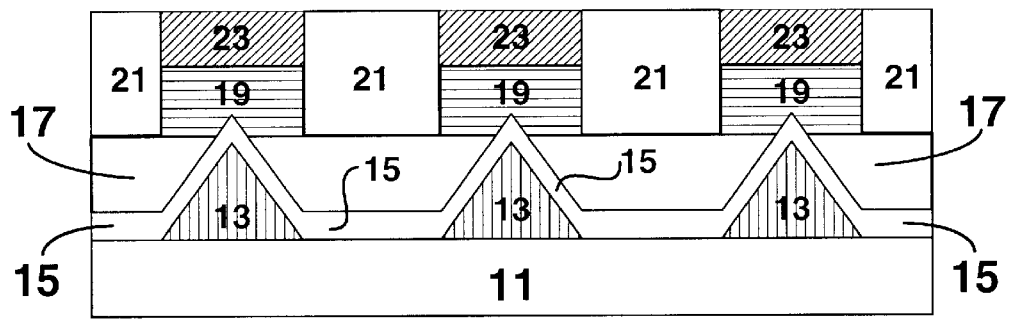

In FIGS. 8A through 8Q, a method of fabricating a low heat loss and small contact area electrode structure for a phase change media memory device 10 is illustrated.

In FIG. 8A, a dielectric layer 13a is carried by a substrate 11. A mask layer is deposited on the dielectric layer 13, is lithographically patterned, and is then etched to define a mandrel mask 31. The dielectric layer 13a and the substrate 11 can be from the materials that were described above. The mask layer 31 can be a layer of photoresist material, for example.

In FIG. 8B, the dielectric layer 13a and the mandrel mask 31 are dry etched using an etch gas that includes a first etch gas for etching the dielectric layer 13a and a second etch gas for etching the mandrel mask 31. A plasma etch system can be used to perform the dry etch and the first etch gas can be introduced into the plasma etch system to etch the dielectric layer 13a and the second etch gas can be introduced into the plasma etch system to etch the mandrel mask 31. For example, the first etch gas can include a fluorocarbon ($CF_x$) based gas and the second etch gas can include oxygen ($O_2$) to ash the photoresist of the mandrel mask 31.

In FIGS. 8C through 8F, the dry etching is continued until the mandrel mask 31 is entirely dissolved (i.e. is etched away) and until the dielectric layer 13a includes a dielectric mandrel 13 having a tapered shape that terminates at a vertex V. The dielectric mandrel 13 has a broad base B, a sloping surface S, and tapers to the vertex V.

In FIG. 8G, an electrically conductive material 15 is conformally deposited on the dielectric mandrel 13 to form a composite electrode 12. A process such as chemical vapor deposition (CVD) can be used to conformally deposit the electrically conductive material 15. As mentioned above, the composite electrode 12 has a shape that complements the dielectric mandrel 13 and terminates at a tip T. The electrically conductive material 15 can be made from materials including but not limited to those set forth above in TABLE 1. For example, after the conformal deposition, the electrically conductive material 15 can be patterned and then etched to define a row conductor or a column conductor (see FIG. 9 where the electrically conductive material 15 is a row conductor) that electrically connects all of the composite electrodes 12 in a row or a column of the array 50.

In FIG. 8H, a first dielectric material 17 is deposited on the composite electrode 12 until the first dielectric material 17 covers the entire composite electrode 12 including the tip T. The first dielectric layer 17 can be made from a material including but not limited to those set forth in TABLE 3 above. A process such as CVD, for example, can be used to deposit the first dielectric material 17.

In FIG. 8I, the first dielectric layer 17 is planarized to form a substantially planar surface. A process such as chemical mechanical planarization (CMP) can be used to planarize the first dielectric layer 17. Alternatively, a reflow process can be used to form a substantially planar surface on the first dielectric layer 17. For the reflow process, the first dielectric layer 17 can comprise a silicate glass, including those set forth in TABLE 3 above. The first dielectric layer 17 is heated to above a reflow temperature of the glass (e.g. above 500° C.) to reflow the glass into a smooth and substantially planar surface. The planarization of the first dielectric layer 17 can be accomplished using other planarization processes and the present invention is not limited to the planarization processes described herein. For instance, a resist etchback planarization process can be used to planarize the first dielectric layer 17.

In FIG. 8J, the first dielectric layer 17 is dry etched until the first dielectric layer 17 recedes below a predetermined distance from the tip T of the composite electrode 12 so that an exposed portion E adjacent to the tip T is not covered by the first dielectric layer 17. A plasma etch process can be used to dry etch the first dielectric layer 17 and that process can be timed to remove a sufficient amount of the first dielectric layer 17 such that the exposed portion E extends outward of the first dielectric layer 17 as depicted in FIG. 8J. The predetermined distance from the tip T will be application dependent. For instance, the predetermined distance can be a distance of about 200 Å from the tip T to first dielectric layer 17. Alternatively, a via (not shown) can be etched in the first dielectric layer 17 to expose the tip T.

In FIG. 8K, a layer of phase change media 29 is deposited on the first dielectric layer 17 and the exposed portion E of the composite electrode 12. For example, a process such as CVD, sputtering, or evaporation can be used to deposit the layer of phase change media 29. A typical material for the layer of phase change media 29 includes but is not limited to a germanium-antimony-tellurium material, such as $Ge_2Sb_2Te_5$, for example.

In FIGS. 8L and 8M, the layer of phase change media 29 is patterned 33 and then etched to define an island of phase change media 19 that is positioned over the composite electrode 12 and in contact with the exposed portion E.

In FIG. 8N, a second dielectric layer 21 is deposited on the first dielectric layer 17 and the islands of phase change media 19. The second dielectric layer 21 can be a material including but not limited to those set forth in TABLE 2 above.

In FIGS. 8O and 8P, the second dielectric layer 21 is planarized using a process such as CMP, for example. Next, the second dielectric layer 21 is patterned 37 and then etched to form vias 39 that extend to the islands of phase change media 19. Preferably, a dry etch process, such as a plasma etch, is used to etch the second dielectric layer 21.

In FIG. 8Q, an electrically conductive material 43 is deposited on second dielectric layer 21 and the vias 39 so that the electrically conductive material 43 is in contact with the islands of phase change media 19. A process such as CVD or sputtering can be used to deposit the electrically conductive material 43.

In FIG. 8P, the electrically conductive material 43 is patterned (not shown) and then etched to define an electrode 23. The electrode 23 may be in contact with the phase change media 19 and the second dielectric layer 21 as illustrated in FIG. 8P, or as described above in reference to FIG. 7, the electrode 23 may be in contact with the phase change media 19. As was mentioned above in reference to FIG. 9, the electrode 23 can be patterned and then etched to define a row conductor or a column conductor (see FIG. 9 where the electrode 23 is a column conductor) that electrically connects all of the electrodes 23 in a row or a column of the array 50.

Prior to the depositing the mask layer 31, as illustrated in FIG. 8A, the dielectric layer 13a can be formed on the substrate 11. The dielectric layer 13a can be deposited on the substrate 11. For example, if the substrate 11 is a silicon (Si) substrate, the dielectric layer 13a can be a layer of silicon oxide ($SiO_2$) deposited on the substrate 11.

In contrast, the dielectric layer 13a can be grown on the substrate 11 by oxidizing the substrate 11. For instance, if the substrate 11 is a silicon (Si) substrate, then a layer of silicon oxide ($SiO_2$) can grown on a surface of the substrate 11 by an oxidation process to form the dielectric layer 13a.

An electrical connection with the electrode 23 or the electrically conductive material 15 of the composite electrode 12 can be accomplished using interconnect structures that are well understood in the microelectronics processing art including patterning and etching a via (not shown) that extends to the electrode 23 or to the electrically conductive material 15 of the composite electrode 12 and then depositing an electrically conductive layer that fills the via and is in contact with the electrode 23 or to the electrically conductive material 15.

Although several embodiments of the present invention have been disclosed and illustrated, the invention is not limited to the specific forms or arrangements of parts so described and illustrated. The invention is only limited by the claims.

What is claimed is:

1. A low heat loss and small contact area electrode structure for a phase change media memory device, comprising:

a substrate;

a composite electrode including a dielectric mandrel connected with the substrate and having a tapered shape terminating at a vertex and an electrically conductive material conformally covering the mandrel and terminating at a tip;

a first dielectric layer covering all but an exposed portion of the composite electrode that is adjacent to the tip;

a phase change media connected with the first dielectric layer and the exposed portion;

a second dielectric layer connected with the first dielectric layer and the phase change media; and an electrode in contact with the phase change media.

2. The low heat loss and small contact area electrode structure of claim 1, wherein the electrode is connected with the phase change media and the second dielectric layer.

3. The low heat loss and small contact area electrode structure of claim 1, wherein the composite electrode has a shape selected from the group consisting of a pyramid, a frustum of a pyramid, a cone, and a frustum of a cone.

4. The low heat loss and small contact area electrode structure of claim 1, wherein the composite electrode and the electrode are conductors selected from the group consisting of a row conductor and a column conductor respectively and a column conductor and a row conductor respectively.

5. The low heat loss and small contact area electrode structure of claim 1, wherein the dielectric mandrel comprises a dielectric layer connected with the substrate.

6. The low heat loss and small contact area electrode structure of claim 5, wherein the dielectric layer is a material selected from the group consisting of a glass, a silicon substrate including a layer of silicon oxide disposed thereon, and a silicon substrate having an oxidized surface.

7. The low heat loss and small contact area electrode structure of claim 1, wherein the first dielectric layer is a material selected from the group consisting of silicon oxide, tetraethylorthosilicate, borosilicate glass, phosphosilicate glass, and borophosphosilicate glass.

8. The low heat loss and small contact area electrode structure of claim 1, wherein the second dielectric layer is a material selected from the group consisting of silicon oxide and silicon nitride.

9. The low heat loss and small contact area electrode structure of claim 1, wherein the electrically conductive material is a material selected from the group consisting of a metal, aluminum, tungsten, molybdenum, titanium, and copper.

10. The low heat loss and small contact area electrode structure of claim 1, wherein the electrode is an electrically conductive material selected from the group consisting of a metal, aluminum, tungsten, molybdenum, titanium, and copper.

* * * * *